(12) United States Patent
Nakatsukasa

(10) Patent No.: US 12,230,512 B2
(45) Date of Patent: Feb. 18, 2025

(54) RESIN MOLDED PRODUCT PRODUCTION METHOD, MOLDING DIE, AND RESIN MOLDING APPARATUS

(71) Applicant: TOWA CORPORATION, Kyoto (JP)

(72) Inventor: Ryota Nakatsukasa, Kyoto (JP)

(73) Assignee: TOWA CORPORATION, Kyoto (JP)

( * ) Notice: Subject to any disclaimer, the term of this patent is extended or adjusted under 35 U.S.C. 154(b) by 400 days.

(21) Appl. No.: 17/669,679

(22) Filed: Feb. 11, 2022

(65) Prior Publication Data

US 2022/0262650 A1 Aug. 18, 2022

(30) Foreign Application Priority Data

Feb. 17, 2021 (JP) ................................. 2021-023804

(51) Int. Cl.
*H01L 21/56* (2006.01)
*B29C 45/14* (2006.01)
(Continued)

(52) U.S. Cl.
CPC ...... *H01L 21/565* (2013.01); *B29C 45/14336* (2013.01); *B29C 45/14655* (2013.01);
(Continued)

(58) Field of Classification Search
CPC .............. H01L 21/565; H01L 21/568; H01L 21/67126; H01L 21/56; B29C 45/14336;
(Continued)

(56) References Cited

U.S. PATENT DOCUMENTS 9,881,814 B2 * 1/2018 Cheon ................... B29C 33/10
9,887,162 B2 * 2/2018 Yu ....................... H01L 23/3128
(Continued)

FOREIGN PATENT DOCUMENTS

JP 2002-110718 4/2002
JP 2003-303919 A 10/2003
(Continued)

OTHER PUBLICATIONS

First Notice of Reasons for Refusal of the corresponding Japanese patent application No. 2021-023804 dated Dec. 19, 2023 and English translation thereof.
(Continued)

*Primary Examiner* — David Vu
*Assistant Examiner* — Brandon C Fox
(74) *Attorney, Agent, or Firm* — Muncy, Geissler, Olds & Lowe, P.C.

(57) ABSTRACT

The present invention provides a resin molded product production method that can reduce the molding defects even when resin-molding is performed in a state where a chip is temporarily bonded to a carrier via a temporary bonding sheet. The method for producing a resin molded product obtained by subjecting an object to be molded being a chip 21 temporarily bonded to a carrier 11 via a temporary bonding sheet 12 to transfer molding, including the step of: resin-molding the object to be molded by transfer molding using a molding die 1000, wherein the resin-molding is performed in a state where a gap G is formed so that the temporary bonding sheet 12 disposed in the molding die 1000 and a surface facing the temporary bonding sheet 12 on a side where the chip 21 is temporarily bonded do not come into contact with each other.

8 Claims, 8 Drawing Sheets

(51) Int. Cl.
*H01L 21/67* (2006.01)
*B29C 45/02* (2006.01)
*B29C 45/17* (2006.01)
*B29L 31/34* (2006.01)

(52) U.S. Cl.
CPC ............ *H01L 21/56* (2013.01); *H01L 21/568* (2013.01); *H01L 21/67126* (2013.01); *B29C 45/02* (2013.01); *B29C 45/1769* (2013.01); *B29L 2031/3406* (2013.01)

(58) Field of Classification Search
CPC .............. B29C 45/14655; B29C 45/02; B29C 45/1769; B29C 45/2602; B29C 45/021; B29L 2031/3406
See application file for complete search history.

(56) References Cited

U.S. PATENT DOCUMENTS

| | | |
|---|---|---|
| 2002/0039811 A1 | 4/2002 | Fujisawa |
| 2005/0070051 A1 | 3/2005 | Nagahama |
| 2005/0176171 A1 | 8/2005 | Miyaki |
| 2006/0216867 A1* | 9/2006 | Kawata ................. H01L 21/561 257/E23.125 |
| 2007/0010046 A1* | 1/2007 | Nagahama ............ H01L 21/565 257/E21.504 |
| 2011/0143552 A1 | 6/2011 | Yanagi et al. |
| 2013/0109138 A1* | 5/2013 | Okada ..................... H01L 21/56 438/127 |
| 2017/0263476 A1* | 9/2017 | Maeda ............. B29C 45/14655 |

FOREIGN PATENT DOCUMENTS

| | | |
|---|---|---|
| JP | 2005-109019 | 4/2005 |
| JP | 2006-088692 | 4/2006 |
| JP | 2010-036515 | 2/2010 |
| JP | 2011-129649 A | 6/2011 |
| JP | 2017-037947 | 2/2017 |
| KR | 10-2015-0036868 A | 4/2015 |
| TW | M356223 U1 | 5/2009 |
| TW | 201130945 A1 | 9/2011 |

OTHER PUBLICATIONS

First Office Action of the corresponding Korean patent application No. 10-2022-0006842 dated May 1, 2023 and English translation thereof.

First Office Action of the corresponding CN application No. 202210070817.0 mailed Mar. 28, 2024 and English translation thereof.

* cited by examiner

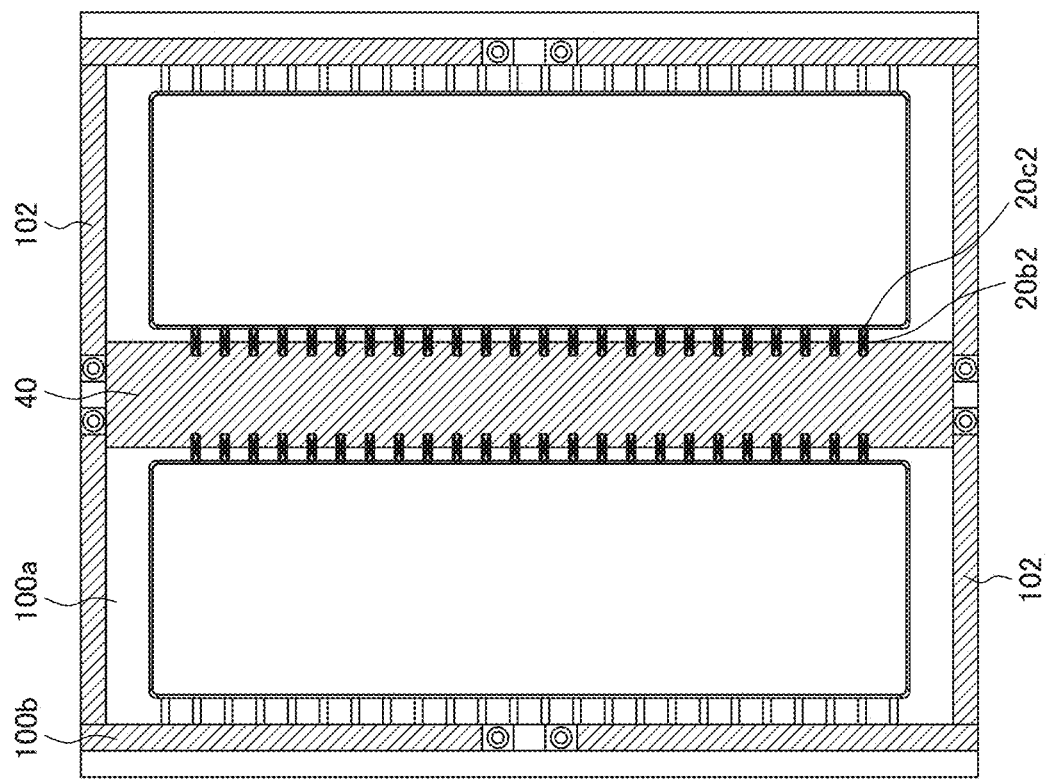
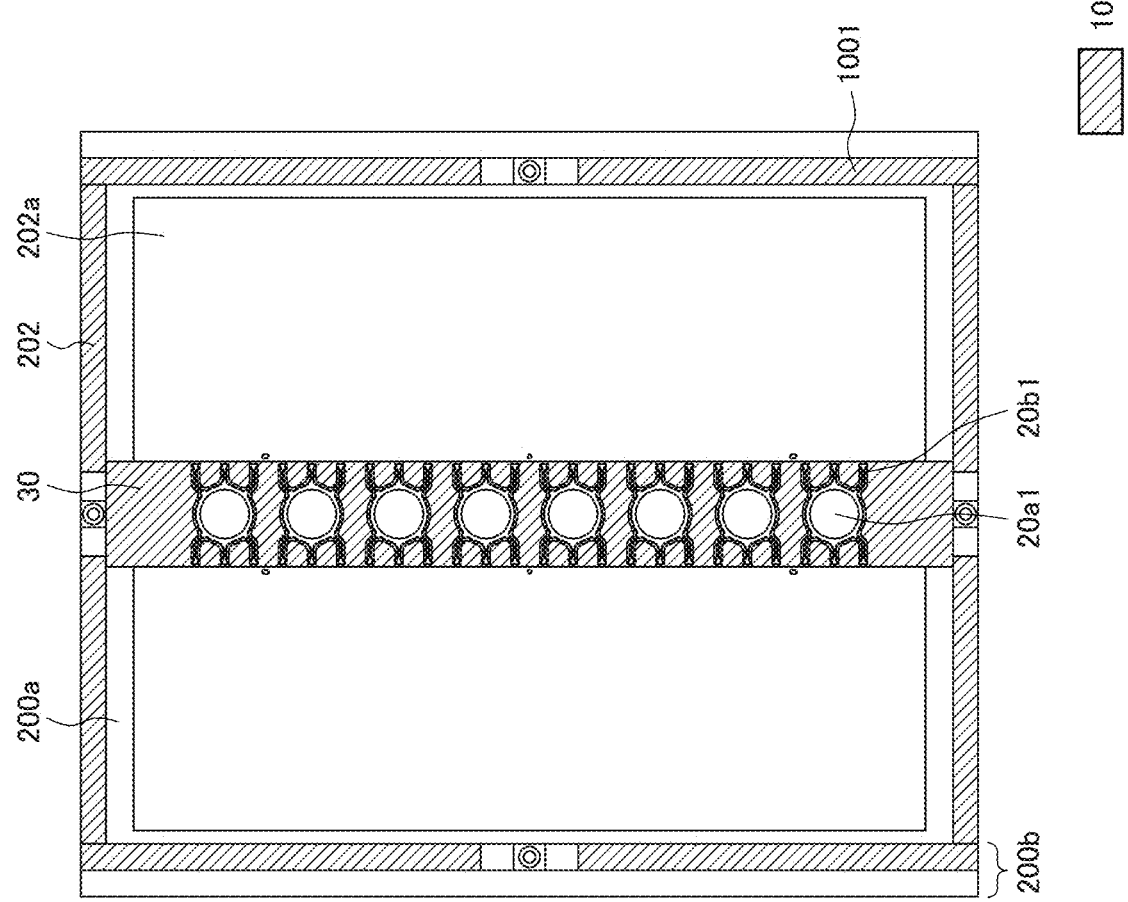
FIG. 2A
FIG. 2B

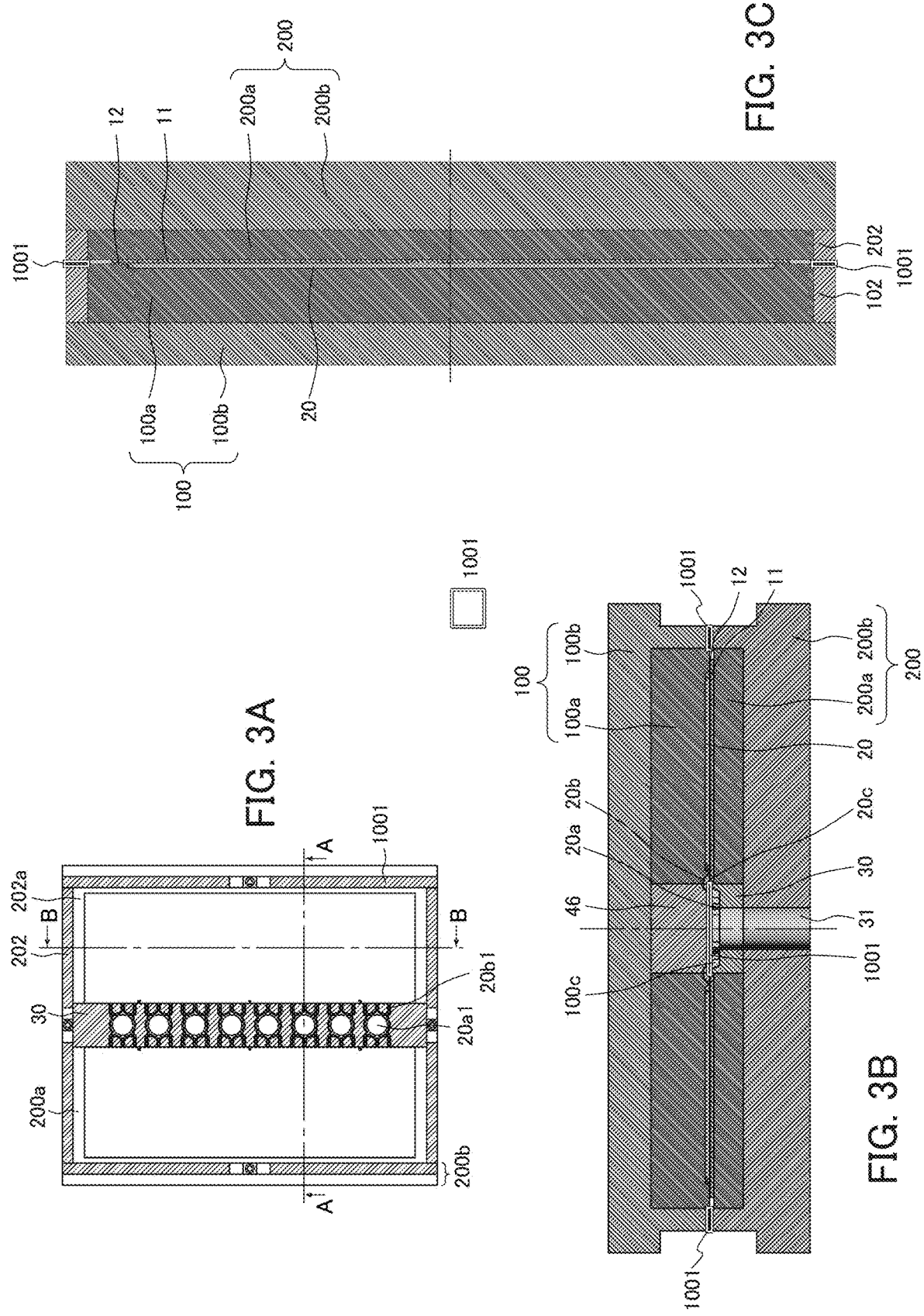

RESIN MOLDED PRODUCT PRODUCTION METHOD, MOLDING DIE, AND RESIN MOLDING APPARATUS

TECHNICAL FIELD

The present invention relates to a resin molded product production method, a molding die, and a resin molding apparatus.

BACKGROUND ART

Electronic devices such as ICs and semiconductor chips (hereinafter, may be referred to simply as "chips") are often used after resin encapsulation (resin molding). More specifically, for example, by encapsulating a chip with a resin, the chip can be made into an electronic component being a chip encapsulated in a resin (also referred to as an electronic component as a finished product, a package, or the like; hereinafter, may be referred to simply as an "electronic component").

For example, JP2011-129649A discloses, in the drawings and the description thereof, a technique in which a chip 1 is temporarily bonded to a substrate (carrier) 3 using a heat-resistant pressure-sensitive adhesive sheet (temporary bonding sheet) 2 for semiconductor device production, and the temporary bonding sheet is peeled off from a resin molded product after resin-molding.

SUMMARY OF INVENTION

Technical Problem

A method for resin-molding an object to be molded being a chip temporarily bonded to a carrier via a temporary bonding sheet as in JP2011-129649A can be performed, for example, as shown in FIGS. 8A and 8B. FIG. 8A is a main part cross-sectional view of a molding die for performing this resin-molding. As shown in FIG. 8A, the molding die includes an upper die 100 and a lower die 200 as main components. The upper die 100 includes an upper die main cavity block 100a and an upper die holder base 100b that holds the upper die main cavity 100a. The lower die 200 includes a lower die main cavity block 200a and a lower die holder base 200b that holds the lower die main cavity 200a. A die cavity is formed on the surface (lower surface) of the upper die main cavity block 100a on the side facing the lower die main cavity block 200a, and resin molding can be performed in the die cavity. As shown in FIG. 8A, a carrier 11 can be placed on the surface (upper surface) of the lower die main cavity block 200a on the side facing the upper die main cavity block 100a. As shown in FIG. 8A, the temporary bonding sheet 12 can be attached to the surface of the carrier 11 on the side opposite to the side in contact with the lower die main cavity block 200a. As shown in FIG. 8A, a chip 21 is temporarily bonded to the surface of the temporary bonding sheet 12 on the side opposite to the side attached to the carrier 11. That is, as shown in FIG. 8A, by attaching the chip 21 to the surface of the temporary bonding sheet 12 on the side opposite to the side in contact with the carrier 11, the chip 21 can be temporarily bonded to the carrier 11 via the temporary bonding sheet 12 (using the temporary bonding sheet 12). As shown in FIG. 8A, die clamping can be performed by bringing the upper die 100 (upper die main cavity block 100a) into contact with the carrier 11 to which the temporary bonding sheet 12 is attached to close and applying pressure from above and below. A pot block 30 and a cull block 40 are disposed on the side of the die cavity of the upper die main cavity block 100a (hereinafter, also referred to simply as a "die cavity"), as shown in FIG. 8A. In a space (also referred to as a pot, not shown in FIGS. 8A and 8B) in the pot block 30, a molten resin (not shown) being a molten resin material for resin molding can be accommodated. The cull block 40 is disposed above the pot block 30. A space enclosed by the pot block 30 and the cull block 40 communicates with the die cavity through a runner and a gate. The molten resin accommodated in the space (pot) in the pot block 30 can be pushed out from below using a plunger (not shown in FIGS. 8A and 8B). Thereby, molten resin can be fed into the die cavity by flowing laterally (i.e., transferring from the side of the die cavity) through the runner and the gate. By solidifying the molten resin below the calf block 40, in the runner, in the gate, and in the die cavity, a cull 20a, a runner resin portion 20b, a gate resin portion 20c, and an encapsulating resin 20 are formed, respectively, as shown in FIG. 8A. Thus, as shown in FIG. 8A, the chip 21 can be resin-molded (resin-encapsulated) in the encapsulating resin 20 in a state where the chip 21 is temporarily bonded to the carrier 11 via the temporary bonding sheet 12 (using the temporary bonding sheet 12).

On the other hand, FIG. 8B is a cross-sectional view of the runner portion of FIG. 8A taken along the line A-A. When the die is clamped as shown in FIG. 8A, a clamping force (also referred to as a clamping load or a clamping pressure) is applied from above and below to the portions other than the runner portion and the gate portion as shown by the arrows in FIG. 8B whereas no clamping force is applied to the runner portion and the gate portion. Therefore, at the portion where the clamping force is applied to the temporary bonding sheet 12, a force for extending the temporary bonding sheet 12 in the lateral direction is applied by the stress caused by the clamping force. Therefore, in the runner portion and the gate portion, a force as pushed inward from both sides of the temporary bonding sheet 12 as shown in FIG. 8B is applied, which may cause the temporary bonding sheet 12 to be lifted. In such a case, the molten resin may enter between the carrier 11 and the temporary bonding sheet 12 at a portion where the temporary bonding sheet 12 is lifted, and molding defects may occur.

With the foregoing in mind, it is an object of the present invention to provide a resin molded product production method, a molding die, and a resin molding apparatus that can reduce the molding defects even when resin-molding is performed in a state where a chip is temporarily bonded to a carrier via a temporary bonding sheet.

Solution to Problem

In order to achieve the above object, the present invention provides a method for producing a resin molded product obtained by subjecting an object to be molded being a chip temporarily bonded to a carrier via a temporary bonding sheet to transfer molding, including the step of: resin-molding the object to be molded by transfer molding using a molding die, wherein the resin-molding is performed in a state where a gap is formed so that the temporary bonding sheet disposed in the molding die and a surface facing the temporary bonding sheet on a side where the chip is temporarily bonded do not come into contact with each other.

The present invention also provides a molding die for use in the method for producing a resin molded product according to the present invention, wherein the resin-molding can be performed in the state where a gap is formed so that the temporary bonding sheet disposed in the molding die and the surface facing the temporary bonding sheet on the side where the chip is temporarily bonded do not come into contact with each other.

The present invention also provides a resin molding apparatus for performing the method for producing a resin molded product according to the present invention, including: the molding die according to the present invention.

Advantageous Effects of Invention

According to the present invention, it is possible to provide a resin molded product production method, a molding die, and a resin molding apparatus that can reduce the molding defects even when resin-molding is performed in a state where a chip is temporarily bonded to a carrier via a temporary bonding sheet.

BRIEF DESCRIPTION OF DRAWINGS

FIG. 2A is a plan view of a lower die and a lower die holder base in the molding die of FIG. 1 seen from the cavity surface. FIG. 2B is a plan view of an upper die and an upper die holder base in the molding die of FIG. 1 seen from the cavity surface.

FIG. 3A is, similarly to FIG. 2A, a plan view of the lower die and the lower die holder base in the molding die of FIG. 1 seen from the cavity surface. FIG. 3B is a cross-sectional view of the molding die of FIG. 2A taken along the line A-A. FIG. 3C is a cross-sectional view of the molding die of FIG. 2A taken along the line B-B.

DESCRIPTION OF EMBODIMENTS

Figure 1:
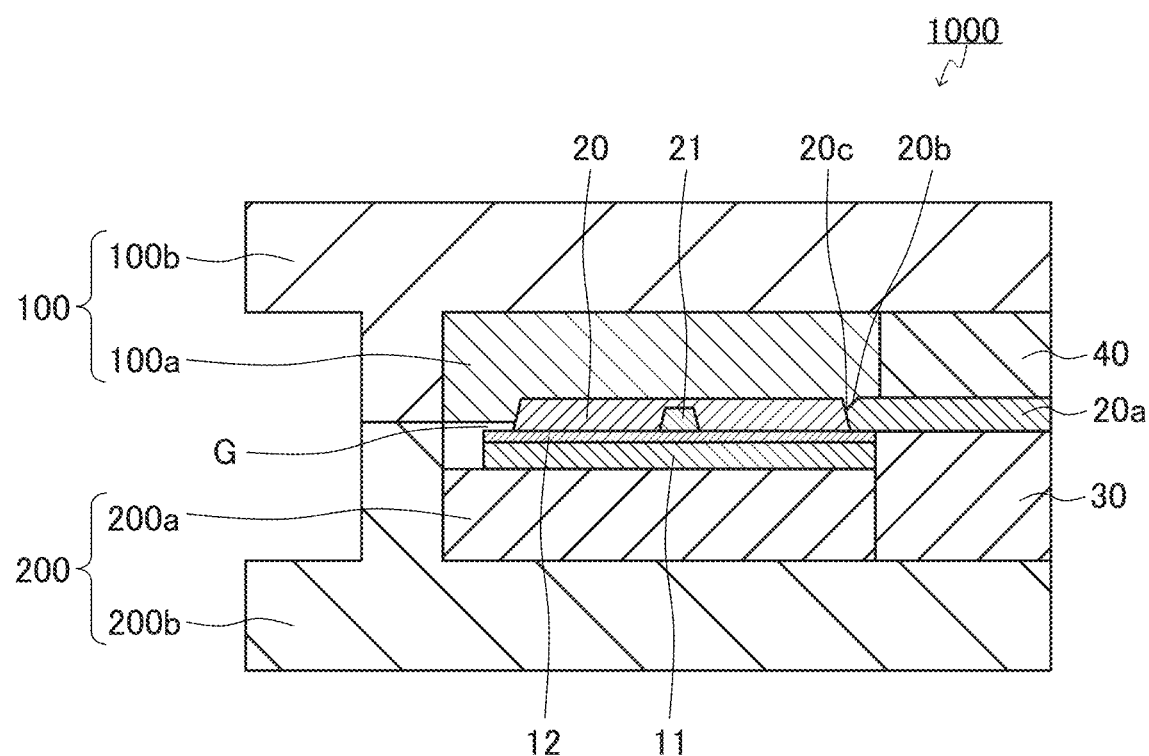
FIG. 1 is a main part cross-sectional view showing an example of a molding die of the present invention and a process of a resin molded product production method of the present invention using the same.

The present invention is described in more detail below with reference to examples. The present invention, however, is not limited by the following description.

The resin molded product production method of the present invention may further include, for example, the step of peeling the temporary bonding sheet from a resin molded product after the resin-molding.

The resin molded product production method of the present invention may further include, for example, the step of adjusting a thickness of the gap by moving at least a part of the molding die.

In the resin molded product production method of the present invention, for example, the resin-molding may be performed in a state where the surface facing the temporary bonding sheet is formed of a release film disposed in the molding die and the gap is formed between the temporary bonding sheet and the release film.

In the resin molded product production method of the present invention, for example, the resin-molding may be performed in a state where the surface facing the temporary bonding sheet is formed of a release film disposed in the molding die and the gap is formed between the temporary bonding sheet and the release film, and the method may further include the step of peeling the temporary bonding sheet from a resin molded product after the resin-molding, wherein the temporary bonding sheet may be a temporary bonding sheet that is peelable from the resin molded product by heating, and the peeling may be performed by heating the temporary bonding sheet and the resin molded product to a temperature higher than that in the resin-molding.

The molding die of the present invention may be, for example, a molding die for use in the resin molded product production method in which the resin-molding is performed in a state where the surface facing the temporary bonding sheet is formed of a release film disposed in the molding die and the gap is formed between the temporary bonding sheet and the release film, and the resin-molding can be performed in a state where a surface of the molding die facing the temporary bonding sheet is covered with a release film and the gap is formed between the temporary bonding sheet and the release film.

The resin molding apparatus may further include, for example, a gap adjusting mechanism for adjusting a thickness of a gap by moving at least a part of the molding die.

In the present invention, the molding die is not particularly limited, and may be a die made of metal, ceramic, or the like, for example.

In the present invention, a resin molded product is not particularly limited, and may be, for example, an electronic component being a chip encapsulated in a resin. Generally, the "electronic component" refers to a chip before resin encapsulation or a resin-encapsulated chip. However, in the present invention, the chip is also referred to as an "electronic element", and the "electronic component" refers to an electronic component (electronic component as a finished product) being the chip encapsulated in a resin. In the present invention, the "chip" and the "electronic element" are synonymous, and the "chip" or the "electronic chip" refers to a chip before resin encapsulation and can be, for example, specifically an IC, a semiconductor chip, a chip such as a semiconductor element, a resistive element, a capacitor element, or the like for power control. The "semiconductor element" refers to, for example, a circuit element made of a semiconductor material. In the present invention, a chip before resin encapsulation is referred to as the "chip" or the "electronic chip" as a matter of convenience in order to differentiate from an electronic component after resin encapsulation. However, the "chip" or the "electronic chip" in the present invention is only required to be an electronic component before resin encapsulation and is not limited to particular electronic components and may not be a chip-like electronic component.

In the present invention, a resin material before molding and a resin after molding are not particularly limited, and may be a thermosetting resin such as an epoxy resin or a silicone resin, or may be a thermoplastic resin, for example. Further, the resin material before molding and the resin after molding may be a composite material containing a thermosetting resin or a thermoplastic resin in a part. In the present invention, the resin material before molding may be in the form of, for example, a powder resin (including granular resin), a liquid resin, a sheet-like resin, a tablet-like resin or the like. Note that, in the present invention, the liquid resin may be liquid at ordinary temperature, or the liquid resin may also include a molten resin which is to be melted by heating to become liquid. The form of the resin may be any other form as long as it can be supplied to a cavity, a pot, or the like of a molding die.

Examples of the present invention will be described below with reference to the drawings. Each drawing is schematically illustrated by appropriately omitting, exaggerating, and the like for convenience of description.

EXAMPLE 1

In the present example, an example of a molding die of the present invention, an example of a resin molding apparatus of the present invention using the same, and an example of a resin molded product production method of the present invention using the same will be described. Note that, as described above, the resin molding method of the present invention is a method for producing a resin molded product by transfer molding. The molding die and resin molding apparatus of the present invention perform resin-molding by transfer molding.

FIG. 1 is a main part cross-sectional view of an example of a molding die of the present invention for performing the resin molded product production method of the present invention. As shown in FIG. 1, a molding die 1000 includes an upper die 100 and a lower die 200 as main components. The upper die 100 includes an upper die main cavity block 100a and an upper die holder base 100b that holds the upper die main cavity 100a. The upper surface and side surface of the upper die main cavity block 100a are covered with the upper die holder base 100b. The lower die 200 includes a lower die main cavity block 200a and a lower die holder base 200b that holds the lower die main cavity 200a. The lower surface and side surface of the lower die main cavity block 200a are covered with the lower die holder base 200b. A die cavity is formed on the surface (lower surface) of the upper die main cavity block 100a on the side facing the lower die main cavity block 200a, and resin molding can be performed in the die cavity. As shown in FIG. 1, a carrier 11 can be placed on the surface (upper surface) of the lower die main cavity block 200a on the side facing the upper die main cavity block 100a. As shown in FIG. 1, the temporary bonding sheet 12 can be attached to the surface of the carrier 11 on the side opposite to the side in contact with the lower die main cavity block 200a. As shown in FIG. 1, a chip 21 is temporarily bonded to the surface of the temporary bonding sheet 12 on the side opposite to the side attached to the carrier 11. That is, as shown in FIG. 1, by attaching the chip 21 to the surface of the temporary bonding sheet 12 on the side opposite to the side in contact with the carrier 11, the chip 21 can be temporarily bonded to the carrier 11 via the temporary bonding sheet 12 (using the temporary bonding sheet 12). As shown in FIG. 1, die clamping can be performed by bringing the side portion of the upper die holder base 100b (the portion covering the upper die main cavity block 100a) into contact with the side portion of the lower die holder base 200b (the portion covering the lower die main cavity block 200a) to close and applying pressure from above and below. At this time, in the present example, as will be described below, the upper die 100 (upper die main cavity block 100a) and the carrier 11 to which the temporary bonding sheet 12 is attached are not in contact with each other, and a gap is formed therebetween. A pot block 30 and a cull block 40 are disposed on the side of the die cavity of the upper die main cavity block 100a (hereinafter, also referred to simply as a "die cavity"), as shown in FIG. 1. In a space (also referred to as a pot, not shown in FIG. 1) in the pot block 30, a molten resin (not shown) being a molten resin material for resin molding can be accommodated. The cull block 40 is disposed above the pot block 30. A space enclosed by the pot block 30 and the cull block 40 communicates with the die cavity through a runner and a gate. The molten resin accommodated in the space (pot) in the pot block 30 can be pushed out from below using a plunger (not shown in FIG. 1). Thereby, the molten resin can be fed into the die cavity by flowing laterally (i.e., transferring from the side of the die cavity) through the runner and the gate. By solidifying the molten resin below the calf block 40, in the runner, in the gate, and in the die cavity, a cull 20a, a runner resin portion 20b, a gate resin portion 20c, and an encapsulating resin 20 are formed, respectively, as shown in FIG. 1. Thus, as shown in FIG. 1, the chip 21 can be resin-molded (resin-encapsulated) in the encapsulating resin 20 in a state where the chip 21 is temporarily bonded to the carrier 11 via the temporary bonding sheet 12 (using the temporary bonding sheet 12).

Figure 8A:
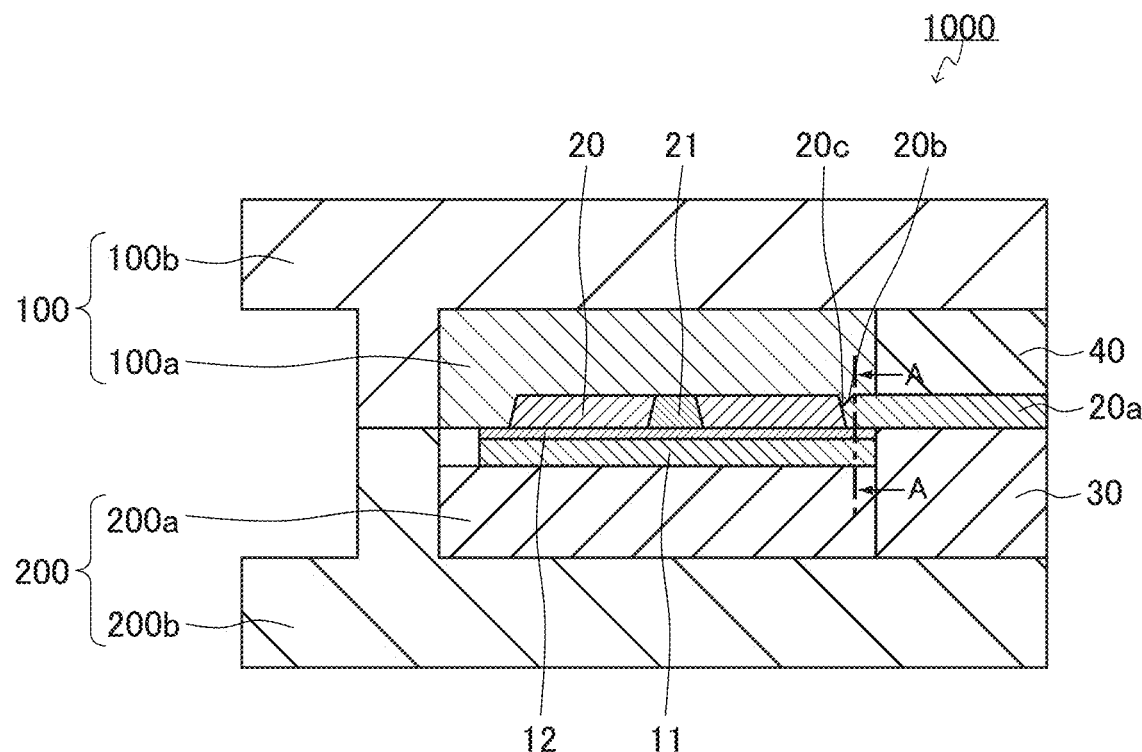
FIGS. 8A and 8B are main cross-sectional views showing an example of a molding die related to the present invention and a process of a resin molded product production method using the same.
Figure 8B:
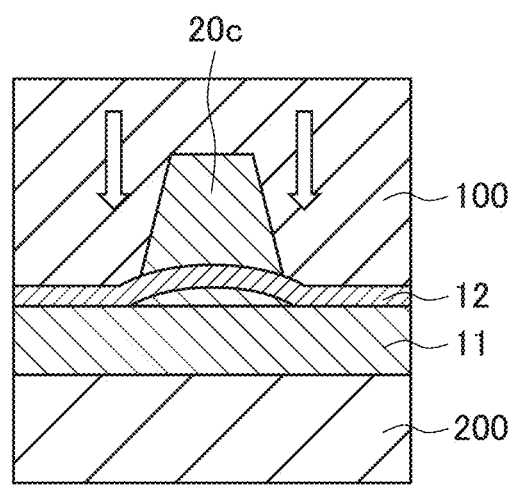

In the molding die 1000 of FIG. 1, as shown in FIG. 1, a gap G is formed so that the temporary bonding sheet 12 disposed in the lower die 200 of the molding die 1000 does not come into contact with the surface of the upper die 100 of the molding die 1000 facing the temporary bonding sheet 12. In this state, the object to be molded being the chip 21 temporarily bonded to the carrier 11 via the temporary bonding sheet 12 can be resin-molded by transfer molding. With the molding die 1000 of FIG. 1, the temporary bonding sheet is not stressed because of the gap G. Therefore, a phenomenon in which the temporary bonding sheet 12 is lifted as described with reference to FIG. 8B can be suppressed or prevented. This can reduce the molding defects of the resin molded product.

The resin molded product production method using the molding die 1000 of FIG. 1 is not particularly limited, and, for example, may be the same as or according to general transfer molding. For example, the resin-molding of an object to be molded by transfer molding is not particularly limited, and, for example, may be the same as or according to general transfer molding. Specifically, for example, as described above, the molten resin accommodated in the pot may be fed into the die cavity by pushing out from below using a plunger and flowing laterally (i.e., transferred from the side of the die cavity) through the runner and the gate. Further, other operations are also not particularly limited, and, for example, may be the same as or according to general transfer molding as described above. In addition, while FIG. 1 shows an example in which a molten resin is used, the present invention is not limited thereto, and for example, a liquid resin which is liquid at room temperature may be used instead of the molten resin. Further, while the upper die 100 has a die cavity and the object to be molded being the chip 21 temporarily bonded to the carrier 11 via the temporary bonding sheet 12 is placed on the die surface of the lower die in FIG. 1, the present invention is not limited thereto and the arrangement of the upper die and the lower die may be reversed. That is, the lower die may have a die cavity, and the object to be molded being the chip 21 temporarily bonded to the carrier 11 via the temporary bonding sheet 12 may be placed on the die surface of the upper die. In such a case, a gap may be formed between the temporary bonding sheet 12 and the surface of the lower die of the molding die facing the temporary bonding sheet 12.

By the resin-molding, a resin molded product production method of the present invention can be performed to produce a resin molded product. In addition, the resin molded product production method of the present invention may or may not include steps other than the resin-molding as appropriate. For example, the resin molded product production method of the present invention may further include the step of peeling the temporary bonding sheet from the resin molded product after the resin-molding as described above. Further, the resin molded product production method of the present invention may further include the step of removing an unnecessary resin portion such as a cull, a runner resin portion, or the like from the resin after molding. This unnecessary resin portion-removing is not particularly limited, and, for example, may be the same as or according to general transfer molding.

Figure 4A:
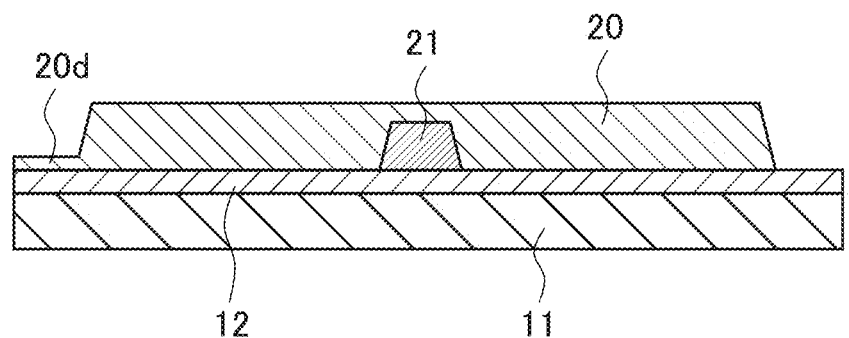
FIGS. 4A and 4B are process cross-sectional views showing an example of peeling a temporary bonding sheet from a resin molded product.
Figure 4B:
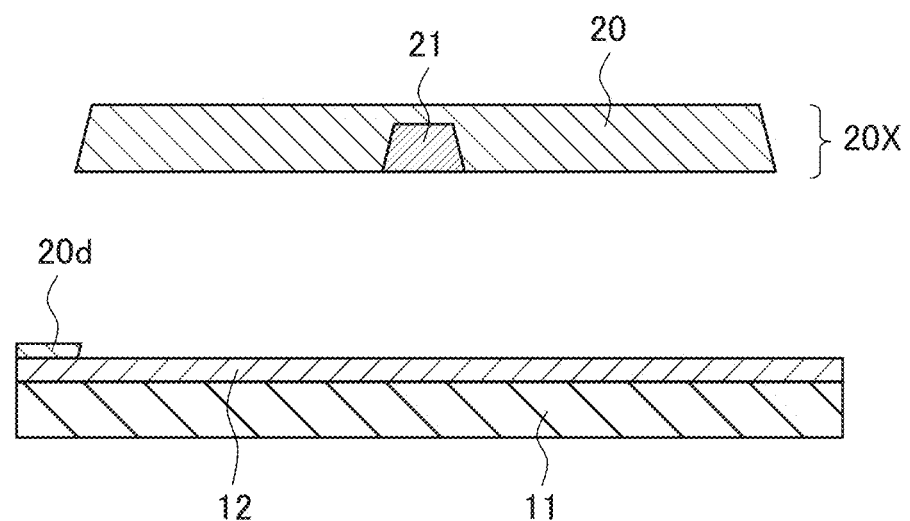

FIGS. 4A and 4B are process cross-sectional views showing an example of peeling the temporary bonding sheet from a resin molded product after the resin-molding. FIG. 4A shows a state in which unnecessary resin portions (the cull 20a, the runner resin portion 20b, and the gate resin portion 20c) are removed from the encapsulating resin 20 after molding by the unnecessary resin-removing described above after the resin-molding described with reference to FIG. 1. As shown in FIGS. 4A and 4B, the chip 21 on the temporary bonding sheet 12 is encapsulated (resin molded) in the encapsulating resin 20. A resin burr (also referred to as flash) 20d adheres to the encapsulating resin 20. This resin burr 20d is formed when the molten resin is flowed into the gap G shown in FIG. 1 and then solidified. First, after the unnecessary resin-removing, as shown in FIG. 4A, the chip 21, the encapsulating resin 20, and the burr 20d are taken out from the molding die 1000 together with the carrier 11 and the temporary bonding sheet 12. Then, as shown in FIG. 4B, the temporary bonding sheet 12 is peeled off from the resin molded product together with the carrier 11 from the state shown in FIG. 4A. The burr 20d is removed from the encapsulating resin 20 in a state of being adhered to the temporary bonding sheet 12 because it is extremely thin. In this way, a resin molded product 20X being the chip 21 encapsulated in the encapsulating resin 20 can be produced.

Conventionally, when resin-molding is performed by transfer molding, it has been common knowledge in the art that a gap is not formed as much as possible between a temporary bonding sheet and a surface facing the temporary bonding sheet in order to prevent resin leakage. However, the inventors of the present invention have found that even if there is an unnecessary burr (flash) caused by resin leakage from the gap between the temporary bonding sheet and the surface facing the temporary bonding sheet, the burr can be removed at the time of peeling off the temporary bonding sheet, so that there is no problem. The specific description is as described with reference to the process cross-sectional views of FIGS. 4A and 4B. From the viewpoint of suppressing or preventing the burr from being large because of the resin pressure concentrating on the gap G between the temporary bonding sheet 12 and the surface of the upper die 100 facing the temporary bonding sheet 12, the gap G is preferably formed in a wide range as much as possible rather than formed in a very narrow range. This is also found by the inventors of the present invention.

The thickness of the gap G between the temporary bonding sheet 12 and the surface of the upper die 100 facing the temporary bonding sheet 12 is not particularly limited and can be appropriately set. A suitable range of the thickness of the gap G varies depending on the material and thickness of the carrier 11, the material and thickness of the temporary bonding sheet 12, the package thickness of the resin molded product (thickness of the encapsulating resin 20), and the like, but is preferably 100 μm or less, and may be, for example, 10 to 90 μm. It is preferable that the thickness of the gap G is not too small from the viewpoint of suppressing or preventing distortion of molding die, molding defects of resin molded product, and the like caused by the magnitude of the clamping pressure. From the viewpoint of suppressing the thickness of the burr caused by the resin flowing from the gap G, it is preferable that the thickness of the gap G is not too large. The thickness of the gap G may be, for example, 10 μm or more, 20 μm or more, 30 μm or more, or 40 μm or more, and may be, for example, 90 μm or less, 80 μm or less, 70 μm or less, 60 μm or less, or 50 μm or less, and may be, for example, about 40 μm.

In FIGS. 1, 4A and 4B, the carrier 11 is not particularly limited, and may be, for example, the same as or according to a carrier used in general transfer molding, and the carrier 11 may be, for example, a plastic film, a glass, a metal, or the like.

In FIGS. 1, 4A and 4B, the temporary bonding sheet 12 is not particularly limited, and may be, for example, the same as or according to the temporary bonding sheet used in general transfer molding. For example, the temporary bonding sheet 12 may be a temporary bonding sheet that can be peeled off by heating. In this case, for example, the peeling of the temporary bonding sheet 12 may be performed by heating the temporary bonding sheet 12 and the resin molded product to a temperature higher than that in the resin-molding as described above. The temperature for the resin-molding and the temperature for the peeling are not particularly limited and can be set as appropriate. As an example, the temperature for the resin-molding can be 145° C. and the temperature for the peeling can be 175° C. The peeling temperature of the temporary bonding sheet 12 varies depending on, for example, the type of the pressure-sensitive adhesive (adhesive) of the temporary bonding sheet 12. For example, the website of Asia Joint http://www.asiajoint.jp/IN_Html/products-PA-06.html (retrieval date: Feb. 1, 2021) shows the temporary bonding sheets (thermal release films) having peeling temperatures of 120° C., 140° C., 200° C., and 260° C. The temporary bonding sheet 12 may be made of, for example, a coating material which is coated on the surface of the carrier 11 and peelable from the carrier 11. Further, for example, when the carrier 11 is a translucent carrier, a temporary bonding sheet 12 which can be peeled off by irradiation of light such as ultraviolet rays can also be used. It is to be noted that the temporary bonding sheet can also be said to be a "tape" from the viewpoint that the temporary bonding sheet can be attached to the carrier 11 by the pressure-sensitive adhesive (adhesive).

FIGS. 2A and 2B are plan views showing the entire configuration of the molding die 1000 of FIG. 1. FIG. 2A is a plan view of the lower die 200 in the molding die 1000 of FIG. 1 seen from the cavity surface (the surface of the lower die 200 on the side facing the upper die 100). FIG. 2B is a plan view of the upper die 100 in the molding die 1000 of FIG. 1 seen from the cavity surface (the surface of the upper die 100 on the side facing the lower die 200). As shown in FIGS. 2A and 2B, the upper die main cavity block 100a, the upper die holder base 100b, the lower die main cavity block 200a, and the lower die holder base 200b are each rectangular. As shown in FIG. 2A, in the center of the lower die 200, the pot block 30 is disposed so as to traverse the entire lower die 200 in a direction parallel to the long side of the rectangular shape of the lower die 200. Carriers (also referred to as frames) 202a are disposed on the die surface (surface on which resin-molding is performed) of the lower die 200 so as to sandwich both sides of the pot block 30. Unlike the carrier 11 shown in FIG. 1, the carriers 202a shown in FIGS. 2A and 2B does not have the chip 21 mounted on it. In the pot block 30, a plurality of pots (spaces in the pot block 30) 20a1 are arranged in series. The pot 20a1 is connected to the lower die runner portion 20b1. Further, as shown in FIG. 2B, at a position facing the pot block 30 at the center of the upper die 100, the cull block 40 is disposed so as to traverse the entire upper die 100. The die surface (surface on which resin-molding is to be performed and on which a die cavity shown in FIG. 1 is formed) of the upper die 100 is disposed so as to sandwich both sides of the cull block 40. Further, the die surface of the upper die 100 is connected to the upper die gate portion 20c2 and the upper die runner portion 20b2. When clamping the upper die 100 and the lower die 200, the lower die runner portion 20b1 and the upper die runner portion 20b2 are fitted to form a runner. Then, the molten resin can be fed into the upper die cavity from the pot 20a1 via the runner and the upper die gate portion 20c2. Further, an outer plate 102 is disposed along two short sides of the rectangular shape of the upper die holder base 100b so as to sandwich the upper die 100. The outer plate 202 is disposed along two short sides of the rectangular shape of the lower die holder base 200b so as to sandwich the lower die 200. Further, in FIGS. 2A and 2B, a clamping area 1001 is shown by shaded lines. The clamping area 1001 is an area where pressure can be applied from above and below when clamping the upper die 100 and the lower die 200. As shown in FIGS. 2A and 2B, clamping area 1001 is present along a rectangular peripheral portion (a portion along the four sides) of each of the upper holder base 100b and the lower holder base 200b and along the surfaces where the pot block 30 and the cull block 40 face each other. As described above, the outer plate 102 and the outer plate 202 are disposed on the short sides of the respective rectangular peripheral edges of the upper die holder base 100b and the lower die holder base 200b.

FIGS. 3A to 3C show cross-sectional views of the molding die of FIGS. 1 and 2A and 2B. FIG. 3A is, similarly to FIG. 2A, a plan view of the lower die 200 in the molding die 1000 of FIG. 1 seen from the cavity surface. FIG. 3B is a cross-sectional view of the entire molding die 1000 of FIG. 2A including the upper die 100 taken along the line A-A. FIG. 3C is a cross-sectional view of the entire molding die 1000 of FIG. 2A including the upper die 100 taken along the line B-B. As shown in FIGS. 3A to 3C, a plunger 31 is disposed in a space (pot) in the pot block 30. By raising the plunger 31, the molten resin (not shown) in the pot can be fed into the die cavity of the upper die 100 by pushing out from the pot and flowing laterally (i.e., transferred from the side of the die cavity) through the runner and the gate. Further, in the cross-sectional views of FIGS. 3B and 3C, the clamping area 1001 of FIGS. 2A and 2B is surrounded by a frame line. Except for the above description, the configuration of the molding die 1000 of FIGS. 2 and 3 is the same as that of FIG. 1. However, in the cross-sectional view of FIG. 3, the gap G between the temporary bonding sheet 12 and the upper die 100 is not shown for simplicity. While FIG. 1 shows a configuration in which the cull 20a is formed on the side of the upper die 100, FIG. 3 shows a configuration in which the cull is formed on the side of the lower die 200.

Figure 5A:
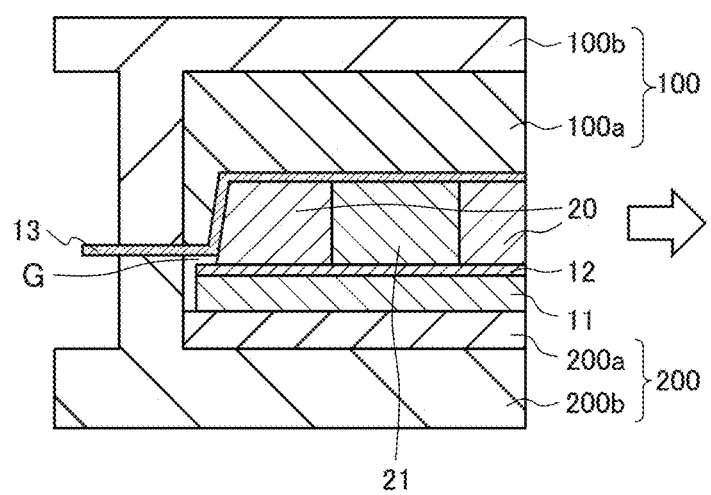
FIGS. 5A to 5C are main part cross-sectional views showing another example of a molding die of the present invention and a process of a resin molded product production method of the present invention using the same.
Figure 5B:
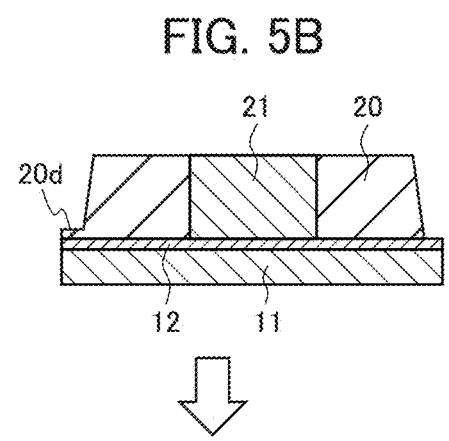
Figure 5C:
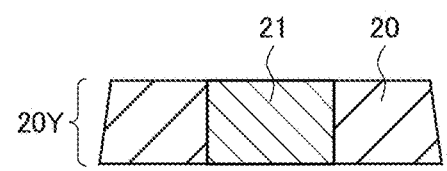

Incidentally, FIGS. 5A to 5C show the process cross-sectional views of a variation of the molding die 1000 of the present example and the resin molded product production method using the same. FIG. 5A is a main part cross-sectional view of the molding die 1000 of FIG. 1 and the resin-molding using the same. As shown in FIGS. 5A to 5C, in this resin-molding, the die surface of the upper die main cavity block 100a and the surface of the upper die holder base 100b (the surfaces facing the lower die main cavity block 200a and the lower die holder base 200b and also facing the temporary bonding sheet 12) are covered with release film 13. While only one surface (surface in contact with the temporary bonding sheet 12) of the chip 21 on the temporary bonding sheet 12 is exposed from the encapsulating resin 20 in FIG. 1, both surfaces (the surface in contact with the temporary bonding sheet 12 and the surface on the opposite side) are exposed from the encapsulating resin 20 in FIG. 5A. The chip 21 and the encapsulating resin 20 are in contact with the release film 13, and are separated from the die surface of the upper die 100 via the release film 13. In FIG. 5A, the gap G is formed between the temporary bonding sheet 12 disposed in the lower die 200 of the molding die 1000 and the surface of the release film 13 disposed in the upper die 100 of the molding die 1000 facing the temporary bonding sheet 12. Except for these, the molding die 1000 shown in FIG. 5A and the resin-molding using the same are the same as those in FIG. 1. The thickness of the gap G is also not particularly limited, and may be, for example, the same as in FIG. 1.

The resin-molding shown in FIG. 5A can be performed in the same manner as that shown in FIG. 1 except that the die surface of the upper die 100 (the die surfaces of the upper die main cavity block 100a and the upper die holder base 100b) is coated with the release film 13 in advance. The method of coating the die surface of the upper die 100 with the release film 13 in advance is not particularly limited, and may be, for example, the same as or according to a general resin molding method. Specifically, for example, the release film 13 may be attracted by sucking the die surface of the upper die 100 using a suction mechanism (not shown, e.g., vacuum pump) from the inside of the upper die 100. The release film 13 is not particularly limited, and may be, for example, the same as or according to a general resin molding method.

FIGS. 5B and 5C are cross-sectional views showing an example of peeling off the temporary bonding sheet from a resin molded product after the resin-molding shown in FIG. 5A. FIG. 5B shows a state in which unnecessary resin portions (the cull 20a, the runner resin portion 20b, and the gate resin portion 20c) are removed from the encapsulating resin 20 after molding by the unnecessary resin-removing described above and the release film 13 is further peeled off after the resin-molding described with reference to FIGS. 4A and 4B. The method of peeling off the release film 13 is not particularly limited, and, for example, may be the same as or according to a general resin molding method. FIG. 5B is the same as FIG. 4A except that both surfaces of the chip 21 are exposed from the encapsulating resin 20. As shown in FIG. 5C, the temporary bonding sheet 12 is peeled off from the resin molded product together with the carrier 11 from this state. The burr 20d is removed from the encapsulating resin 20 in a state of being adhered to the temporary bonding sheet 12 as in FIG. 4B because it is extremely thin. In this way, a resin molded product 20Y being the chip 21 encapsulated in the encapsulating resin 20 can be produced. Although a resin molded product being the chip whose both surfaces are exposed from the encapsulating resin 20 is difficult to be produced by compression molding, such a resin molded product 20Y can be produced according to the present invention.

The method using a release film is suitable for producing a resin molded product being the chip whose both surfaces are exposed from the encapsulating resin, for example, as in FIGS. 5A to 5C. However, the present invention is not limited thereto, and the release film 13 can be used in the same manner as in FIGS. 5A to 5C even when only one surface of the chip 21 is exposed from the encapsulating resin 20 (the surface in contact with the temporary bonding sheet 12) as in FIGS. 1, 4A and 4B, for example.

Further, as described above, the resin molded product production method of the present invention may further include the step of adjusting a thickness of a gap by moving at least a part of the molding die. As described above, the resin molding apparatus may further include a gap adjusting mechanism for adjusting a thickness of a gap into which the resin can flow by moving at least a part of the molding die. The gap adjusting mechanism is not particularly limited, and may include, for example, a cotter.

Figure 6:
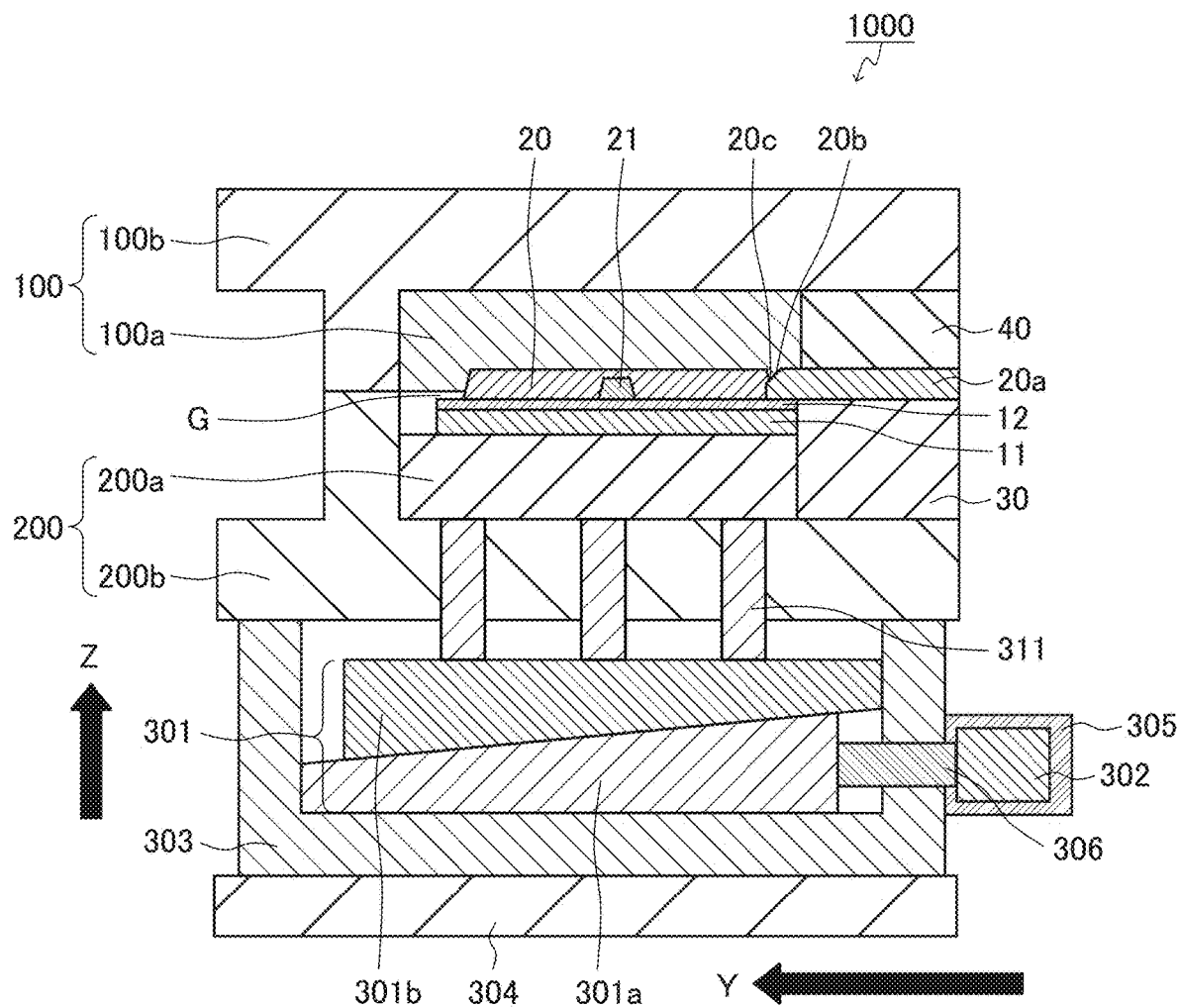
FIG. 6 is a cross-sectional view showing an example of a mechanism for changing the height of the lower die in the molding die of the present invention.

In the present invention, the cotter as the gap adjusting mechanism and the method of using the cotter are not particularly limited, and, for example, may be the same as or according to a general resin molding apparatus. An example is shown in the cross-sectional view of FIG. 6. FIG. 6 is the same as FIG. 1 except that a cotter (wedge-shaped member) 301 is disposed below the molding die 1000 and a pillar 311 is disposed between the cotter 301 and the lower die main cavity block 200a. The cotter 301 corresponds to a gap adjusting mechanism that adjusts the thickness of the gap by moving at least a part of the molding die. As shown in FIG. 6, the cotter 301 is formed of a pair of cotters (wedge-shaped members), a first cotter (first wedge-shaped member) 301a and a second cotter (second wedge-shaped member) 301b. As shown in FIG. 6, one surface of each of the first cotter 301a and the second cotter 301b in the thickness direction (up and down direction on the sheet) is a tapered surface. More specifically, as shown in FIG. 6, the upper surface of the first cotter 301a and the lower surface of the second cotter 301b are tapered surfaces. The first cotter 301a and the second cotter 301b are disposed so that their tapered surfaces face each other.

Further, the cotter 301 is connected to a drive mechanism 302 via a cotter power transmission member 306 as shown in FIG. 6. Then, by sliding the cotter 301 in the tapered direction of the tapered surface of the cotter 301 (right and left direction on the sheet) using the drive mechanism 302, the length of the cotter 301 in the thickness direction can be changed. For example, as shown in FIG. 6, the first cotter 301a is slid in the leading end direction (left side on the sheet), i.e., in the direction of the arrow Y in FIG. 6. As a result, the second cotter 301b slides rightward relative to the first cotter 301a. This raises the second cotter 301b (i.e., moves in the direction of the arrow Z in FIG. 6) and thus the length of the cotter 301 in the thickness direction (up and down direction on the sheet) increases. On the other hand, by sliding the first cotter 301a in the direction opposite to the arrow Y in FIG. 6, the length of the cotter 301 in the thickness direction (up and down direction on the sheet) can be reduced.

In the example of FIG. 6, the driving mechanism 302 can slide the first wedge-shaped member (first cotter) 301a located below the cotter 301 in the horizontal direction (right and left direction on the sheet). However, the present invention is not limited thereto, and for example, the driving mechanism 302 may slide the second wedge-shaped member (second cotter) 301b located above the cotter 301, or may slide both the first cotter 301a and the second cotter 301b. The drive mechanism 302 is not particularly limited, and examples thereof include a servo motor and an air cylinder.

Further, while the entire one surface of each of the first cotter 301a and the second cotter 301b is a tapered surface in FIG. 6, the cotter 301 used as the gap adjusting mechanism of the present invention is not limited thereto as long as at least one wedge-shaped member is slidable along the tapered surface. For example, in one or both of the first cotter 301a and the second cotter 301b, only a part of one surface may be a tapered surface. More specifically, for example, in at least one of the first cotter 301a and the second cotter 301b, only the chip side (thin side) of one surface may be a tapered surface, and the root side (thick side) may be a horizontal plane.

Furthermore, as shown in FIG. 6, the cotter 301, which is the air gap adjusting mechanism, is stored in the mold base 303. The mold base 303 is placed on the upper surface (plane) of the platen 304. That is, the cotter 301 is attached to the platen 304 via the mold base 303. The drive mechanism 302 is connected to the mold base 303 via a fixing member 305. Further, the drive mechanism 302 is mounted to the cotter 301 via a cotter power transmission member 306, and can drive the cotter 301. Note that, the cotter 301, the drive mechanism 302, and the cotter power transmission member 306 are the same as those shown in FIGS. 1 and 2A and 2B. The drive mechanism 302 is mounted so as to be fixed with respect to the platen 304, and the cotter 301 is mounted so as to be movable with respect to the platen. Thus, the position of the cotter 301 with respect to the platen 304 can be adjusted by using the drive mechanism 302.

The pillar 311 penetrates the lower die holder base 200b. The lower surface of the pillar 311 is in contact with the upper surface of the second cotter 301b. The upper surface of the pillar 311 is in contact with the lower surface of the lower die main cavity block 200a. When the second cotter 301b moves vertically as described above, the pillar 311 moves vertically, and at the same time, the lower die main cavity block 200a moves vertically. By this vertical movement of the lower die main cavity block 200a, the thickness of the gap G formed between the temporary bonding sheet 12 and the surface of the upper die 100 facing the temporary bonding sheet 12 can be changed.

The resin molding apparatus of the present invention is an apparatus including the molding die of the present invention and is for performing the resin molded product production method of the present invention. The configuration of the resin molding apparatus of the present invention is not particularly limited, and, for example, may be the same as or according to a general resin molding apparatus except that it includes the molding die of the present invention.

Figure 7:
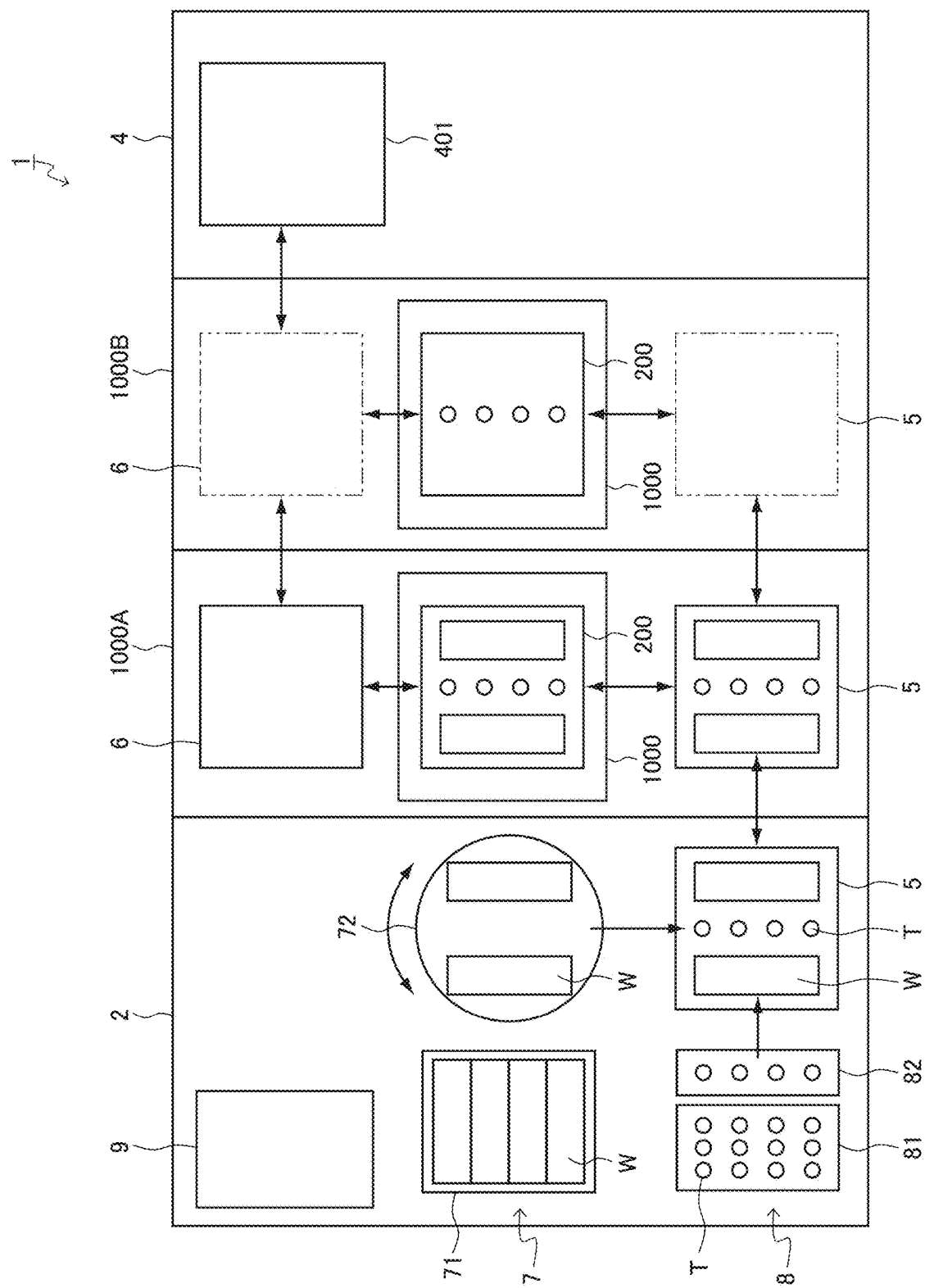
FIG. 7 is a plan view showing an example of the configuration of the entire resin molding apparatus of the present invention.

FIG. 7 is a plan view showing an example of the configuration of the entire resin molding apparatus of the present invention. As shown in FIG. 7, a resin molding apparatus 1 includes: a supply module 2 for supplying a carrier before resin encapsulation (resin molding) W (hereinafter referred to as "career before encapsulation W") and resin tablets T; two resin molding modules 1000A and 1000B for resin molding, for example; and a conveying module 4 for conveying a resin molded product, as components. In the career before encapsulation W, for example, as shown in FIG. 1, FIGS. 4A and 4B, or FIG. 5, the temporary bonding sheet 12 is attached on the carrier 11, and the chip 21 is temporarily bonded on the temporary bonding sheet 12. The supply module 2, the resin molding modules 1000A and 1000B, and the conveying module 4, which are components of the resin molding apparatus 1, can be attached to and detached from one another and can be replaced with one another.

The resin molding apparatus 1 further includes: a conveying mechanism 5 (hereinafter referred to as a "loader 5") for conveying the careers before encapsulation W and the resin tablets T supplied by the supply module 2 to the resin molding modules 1000A and 1000B; and a conveying mechanism 6 (hereinafter referred to as an "unloader 6") for conveying the resin molded product resin-molded by the resin molding modules 1000A and 1000B to the conveying module 4. Note that the resin tablets T can be made into a molten resin by melting. Further, the molten resin can be made into the encapsulating resin 20 shown in FIG. 1, FIGS. 4A and 4B, or FIG. 5 by solidifying (curing).

The supply module 2 of the present embodiment is formed by integrating a substrate supply module 7 and a resin supply module 8.

The substrate supply module 7 includes a substrate delivery unit 71 and a substrate supply unit 72. The substrate delivery unit 71 sends the career before encapsulation W in a magazine to a substrate aligning unit. The substrate supply unit 72 receives the career before encapsulation W from the substrate delivery unit 71, aligns the received career before encapsulation W in a predetermined direction, and transfers the career before encapsulation W to the loader 5.

The resin supply unit 8 includes a resin delivery unit 81 and a resin supply unit 82. The resin delivery unit 81 receives the resin tablets T from the stocker 83 to be described below, and delivers the resin tablets T to the resin supply unit 82. The resin supply unit 82 receives the resin tablets T from the resin delivery unit 81, aligns the received resin tablets T in a predetermined direction, and transfers the resin tablets T to the loader 5.

Each of the resin molding modules 1000A and 1000B includes a molding die 1000. As shown in FIGS. 1 to 3C, the molding die 1000 includes a lower die 200 and an upper die 100.

In addition, a heating unit such as a heater (not shown) may be embedded in each of the upper die 100 and the lower die 200. The upper die 100 and the lower die 200 can be heated by the heating unit.

The operation of the resin molding apparatus 1 of FIG. 7 is, for example, as follows. First, the substrate delivery unit 71 delivers the career before encapsulation W in the magazine to the substrate supply unit 72. The substrate supply unit 72 aligns the received career before encapsulation W in a predetermined direction and transfers the career before encapsulation W to the loader 5. In parallel therewith, the resin delivery unit 81 delivers the resin tablets T received from the stocker 83 to the resin supply unit 82. The resin supply unit 82 transfers the required number of the received resin tablets T (four in FIG. 7) to the loader 5.

Next, the loader 5 conveys received two careers before encapsulation W and four resin tablets T to the molding die 1000 at the same time. The loader 5 supplies the careers before encapsulation W to the site to which the lower die 200 is mounted and supplies the resin tablets T to the inside of the pot formed in the lower die 200.

Thereafter, the upper die 100 and the lower die 200 are clamped. Then, the molten resin obtained by heating and melting the resin tablet T in each pot block 30 (see FIGS. 1 to 3C) is pressed by the plunger 31 (see FIGS. 3A to 3C). Thereby, the molten resin is injected into the inside of the cavity formed in the upper die 100 through a runner (resin passage) and a gate (see FIGS. 2A to 3C). Subsequently, by heating the molten resin for a required time necessary for curing, the molten resin is cured to form a cured resin. Thereby, the chip 21 in the cavity of the upper die and the temporary bonding sheet 12 around it are encapsulated in the cured resin (encapsulating resin) which is formed corresponding to the shape of the die cavity.

Next, after the elapse of the time required for curing, the upper die 100 and the lower die 200 are opened to release a resin molded product (not shown). Thereafter, the resin molded product resin-encapsulated by the molding die 1000 is accommodated in a substrate accommodating unit 401 of the conveying module 4 by using the unloader 6.

The entire operation of the resin molding apparatus 1 including the above series of operations is controlled by the control unit 9. While the control unit 9 is provided in the supply module 2 in FIG. 1, the control unit 9 may be provided in other modules. The control unit 9 is composed of, for example, a special-purpose or general-purpose computer having a CPU, an internal memory, an AD converter, an input/output inverter, and the like.

The present invention is not limited to the aforementioned Examples; and arbitrary and suitable combinations, changes, or selective adoption thereof can be made as necessary without departing from the spirit and scope of the present invention.

REFERENCE SIGNS LIST

This application claims priority from Japanese Patent Application No. 2021-023804 filed on Feb. 17, 2021. The entire subject matter of the Japanese Patent Applications is incorporated herein by reference.

1: resin molding apparatus
2: supply module
4: conveying module
5: conveying mechanism (loader)
6: conveying mechanism (unloader)
7: substrate supply module
8: resin supply module
9: control unit
11: carrier
12: temporary bonding sheet
13: release film
20: resin (encapsulating resin)
20a: cull
20b: runner resin portion
20c: gate resin portion
20d: burr (flash)
20a1: pot
20b1: lower die runner portion
20b2: upper die runner portion
20c2: upper die gate portion
20X, 20Y: resin molded product
21: chip
30: pot block
31: plunger
40: cull block
71: substrate delivery unit
72: substrate supply unit
81: resin delivery unit
82: resin supply unit
83: stocker
100: upper die
100a: upper die main cavity block
100b: upper die holder base
102: outer plate
200: lower die 200a: lower die main cavity block
200b: lower die holder base
202: outer plate
202a: carrier (frame)
301: cotter (gap adjusting mechanism)
301a: first cotter (first wedge-shaped member)
301b: second cotter (second wedge-shaped member)
302: drive mechanism
303: mold base
304: platen (movable platen)
305: fixing member
306: cotter power transmission member
401: substrate accommodating unit
1000: molding die
1000A, 1000B: resin molding module
1001: clamping area
T: resin tablet
W: career before encapsulation
Y, Z: arrow

The invention claimed is:

1. A method for producing a resin molded product obtained by subjecting an object to be molded being a chip temporarily bonded to a carrier via a temporary bonding sheet to transfer molding, comprising the steps of:
resin-molding the object to be molded by transfer molding using a molding die, and
peeling the temporary bonding sheet from the resin molded product after the resin-molding, wherein
the resin-molding is performed in a state where a gap is formed so that the temporary bonding sheet disposed in the molding die and a surface facing the temporary bonding sheet on a side where the chip is temporarily bonded do not come into contact with each other,
the temporary bonding sheet is a temporary bonding sheet that is peelable from the resin molded product by heating, and
the peeling is performed by heating the temporary bonding sheet and the resin molded product to a temperature higher than that in the resin-molding.

2. The method according to claim 1, further comprising the step of:
peeling the temporary bonding sheet from the resin molded product after the resin-molding.

3. The method according to claim 1, further comprising the step of:
adjusting a thickness of the gap by moving at least a part of the molding die.

4. The method according to claim 1, wherein
the resin-molding is performed in a state where the surface facing the temporary bonding sheet is formed of a release film disposed in the molding die and the gap is formed between the temporary bonding sheet and the release film.

5. A molding die for use in the method for producing the resin molded product according to claim 1, wherein
the resin-molding can be performed in a state where the gap is formed so that the temporary bonding sheet disposed in the molding die and the surface facing the temporary bonding sheet on the side where the chip is temporarily bonded do not come into contact with each other.

6. The molding die according to claim 5, wherein
the resin-molding is performed in a state where the surface facing the temporary bonding sheet is formed of a release film disposed in the molding die and the gap is formed between the temporary bonding sheet and the release film,
the resin-molding can be performed in a state where a surface of the molding die facing the temporary bonding sheet is covered with the release film and the gap is formed between the temporary bonding sheet and the release film.

7. A resin molding apparatus for performing the method for producing the resin molded product according to claim 1, wherein
the resin-molding can be performed in a state where the gap is formed so that the temporary bonding sheet disposed in the molding die and the surface facing the temporary bonding sheet on the side where the chip is temporarily bonded do not come into contact with each other.

8. The resin molding apparatus according to claim 7, further comprising:
a gap adjusting mechanism for adjusting a thickness of a gap by moving at least a part of the molding die.

* * * * *